United States Patent
Inoue et al.

(10) Patent No.: US 6,406,923 B1
(45) Date of Patent: Jun. 18, 2002

(54) PROCESS FOR RECLAIMING WAFER SUBSTRATES

(75) Inventors: Hidetoshi Inoue; Satoru Takada, both of Hayward, CA (US); Yoshihiro Hara, Kobe (JP)

(73) Assignees: Kobe Precision Inc., Hayward, CA (US); Kabushiki Kaisha Kobe Seiko Sho, Kobe (JP)

( * ) Notice: Subject to any disclaimer, the term of this patent is extended or adjusted under 35 U.S.C. 154(b) by 0 days.

(21) Appl. No.: 09/630,316

(22) Filed: Jul. 31, 2000

(51) Int. Cl.$^7$ ............................................. H01L 21/00
(52) U.S. Cl. ......................................................... 438/4
(58) Field of Search ........................... 438/4, 471, 472; 51/307, 308, 309

(56) References Cited

U.S. PATENT DOCUMENTS

| | | | |
|---|---|---|---|
| 3,923,567 A | * | 12/1975 | Lawrence |
| 4,738,056 A | * | 4/1988 | Suzuki |
| 5,051,375 A | * | 9/1991 | Sakata et al. |
| 5,131,979 A | | 7/1992 | Lawrence |
| 5,622,875 A | * | 4/1997 | Lawrence |
| 5,855,735 A | * | 1/1999 | Takada et al. |
| 5,981,301 A | | 11/1999 | Muramatsu et al. |

FOREIGN PATENT DOCUMENTS

| | | |
|---|---|---|
| EP | 0 401 147 | 12/1990 |
| EP | 0 588 055 | 3/1994 |
| EP | 0 774 776 | 5/1997 |
| EP | 0 986 097 | 3/2000 |
| JP | 51-001966 | 1/1976 |
| JP | 9-171981 | 6/1997 |
| JP | 9-237771 | 9/1997 |
| WO | WO 94/28194 | 12/1994 |

* cited by examiner

Primary Examiner—Michael J. Sherry
Assistant Examiner—Evan Pert
(74) Attorney, Agent, or Firm—Oblon, Spivak, McClelland, Maier & Neustadt, P.C.

(57) ABSTRACT

A process capable of reclaiming used semiconductor wafers with a reduced metallic contamination level on wafer surfaces. The process comprises the steps of removing one or more surface layers of the substrate by chemical etching; scraping off one surface of the substrate in small amount by mechanical machining; removing a damage layer, which has occurred due to the mechanical machining, by chemical etching; and polishing the other surface of the substrate into a mirror finish.

7 Claims, 1 Drawing Sheet

PROCESS FOR RECLAIMING WAFER SUBSTRATES

BACKGROUND OF THE INVENTION

1. Field of the Invention

The present invention relates to a process for reclaiming a wafer substrate from a semiconductor wafer, and more particularly to a process for manufacturing a reclaimed wafer that has substantially the same quality as prime wafers used for the manufacture of semiconductor circuit parts. Especially, the process of the present invention reclaims used wafers with a low metallic contamination level.

2. Description of the Related Art

Single-crystal silicon wafers having two different qualities are used in semiconductor manufacturing processes. "Prime" quality wafers are used for manufacturing actual semiconductor products, and "test" quality wafers are used for confirming whether the manufacturing processes have satisfactory performance. "Prime" wafers satisfy higher quality standards than "test" wafers. "Test" wafers having quality comparable to that of "prime" wafers are preferred by semiconductor companies and are sold at a higher price than standard quality "test" wafers. A typical used semiconductor wafer comprises a silicon wafer with semiconductor components implanted and/or diffused into one wafer surface (hereinafter called "active surface"). In addition, coating layers of conducting and insulating materials are formed on the implanted and/or diffused surface of the wafer.

The term "surface layers" as used herein refers to both implanted and/or diffused portions of an original wafer and layers formed or deposited on the surface of the original wafer.

Reclaiming implies removing both the surface layers and subsurface portions of the wafer just underlying the implanted and/or diffused portions at the wafer surface. Used wafers sent to a reclamation service company have a variety of surface and subsurface structures. Some wafers have been used for film thickness measurement and have several film layers on the surface. Others may be rejects from the product wafer manufacturing processes and have layered structures, film material combinations and implanted elements which differ from one wafer to another. The reclaimed wafer is required to have surface properties similar to those of a new wafer and a metallic contamination level at an order as low as that of a new wafer.

Heretofore, several methods have been employed to reclaim a wafer substrate from a used semiconductor wafer.

Chemical etching is the most common technique in the conventional reclamation methods. For example, Japanese Unexamined Patent Application Publication No. 51-1966 discloses a process of immersing a wafer substrate having surface layers in a bath that contains sulfuric acid for removing organic-materials, hydrochloric acid and nitric acid for removing metallic materials, and hydrofluoric acid for removing oxides and nitrides. It is further disclosed that a preferable etching rate is 12 μm per minute. Also, a mixture of nitric acid ($HNO_3$) and hydrofluoric acid (HF), which is capable of removing most of films and implanted elements, is often used in etching to reclaim silicon wafers. After thus removing the surface layers by chemical etching, a front surface of a wafer is finished into a mirror surface by chemical mechanical polishing.

U.S. Pat. No. 5,131,979 discloses a wafer reclaiming process featured in comprising stripping away surface layers to expose the original wafer surface by chemical etching, alone, or mechanical grinding followed by chemical etching. After removing the wafer edge, the surface is polished smooth and thermally treated to free the surface of lattice defects and to leave in the interior lattice defects that will become gettering sites.

In the case of removing surface layers of a wafer substrate by chemical etching, materials making up the surface layers are gradually dissolved in a chemical etchant. Since the surface layers contain a metallic film, e.g., an aluminum film, in addition to an insulating coating such as silicon oxide, the content of a metallic component dissolved in the chemical etchant increases with the progress of the reclamation process. As the content of the metallic component in the chemical etchant increases, an amount of the metallic component attaching again to surfaces of the wafer, which is immersed in the chemical etchant for removing the surface layers, also increases correspondingly. The metallic component attaching again to a front surface of the wafer substrate can be avoided from remaining still in a final product, because the substrate front surface is removed by a subsequent step of chemical mechanical polishing. However, a back surface of the wafer substrate remains the same in the final product as just after being etched by the chemical etchant. Accordingly, if there occurs metallic contamination on the back surface, the final product cannot satisfy the quality requirements regarding metallic contamination. As shown in the road map laid open by the SIA, in particular, a metallic contamination level required for semiconductor wafers tends to become strict more and more in the future. The technique for avoiding metallic contamination is therefore essential, taking into account a limitation in management of a metallic contamination level of the chemical etchant used for removing the surface layers.

Further, scratches often occur in surfaces of a used wafer due to rough handling or contact with equipment in a semiconductor company. A chemical etching rate has a tendency to increase in an area where a mechanical damage such as a scratch is present. Accordingly, the scratch is rather intensified by chemical etching in some cases. If a scratch is left on the back surface, the scratch remains as it is in a final product, and therefore the final product cannot satisfy the quality requirements with respect to the back surface.

Moreover, stains attributable to residuals of chemical fluids or deposition of reaction products are produced on the wafer surfaces after the chemical etching. If such stains are produced on the back surface, the stains remain as they are in a final product, and therefore the final product cannot satisfy the quality requirements with respect to the back surface.

SUMMARY OF THE INVENTION

An object of the present invention is to provide a process capable of reclaiming used semiconductor wafers with a reduced metallic contamination level on wafer surfaces.

To achieve the above object, according to the present invention, a process for reclaiming a used wafer substrate comprises the steps of removing one or more surface layers of the substrate by chemical etching; scraping off one surface of the substrate in a small amount by blasting; removing a damage layer, which has occurred due to the blasting, by chemical etching; and polishing the other surface of the substrate into a mirror finish.

DESCRIPTION OF THE PREFERRED EMBODIMENT

The present invention will be described below in detail in conjunction with a silicon semiconductor wafer, but the present invention is not limited to the following embodiment. It is to be noted that the present invention is also applicable to a process for reclaiming used wafers made of other materials such as gallium—arsenic, sapphire, GGG, and indium—phosphorus.

A reclaiming process according to the present invention mainly comprises the steps of:

a) immersing a used wafer substrate in a chemical etchant and removing surface layers of the substrate;

b) scraping off one surface of the substrate in small amount by blasting as a form of mechanical machining;

c) removing a damage layer, which has occurred due to the blasting, by chemical etching; and d) polishing the other surface of the substrate.

Figure 1:
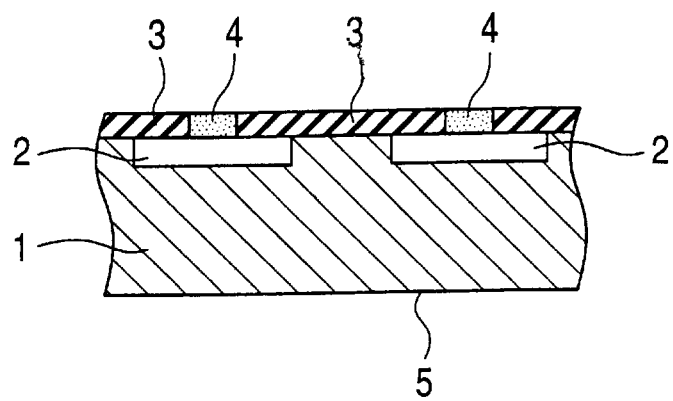
FIG. 1 is a partial sectional view of a used wafer.
Figure 2:
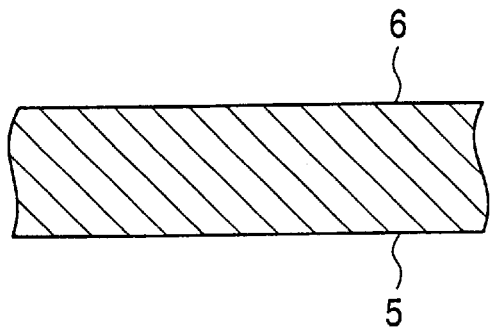
FIG. 2 is a partial sectional view of the wafer in which surface layers have been removed by chemical etching according to a reclaiming process of the present invention.

FIG. 1 is a partial sectional view of a used wafer not yet subjected to the reclaiming process, and FIG. 2 is a partial sectional view of the wafer in which surface layers have been removed by chemical etching from the state of FIG. 1.

One or more surface layers, such as an implanted layer 2, an insulating film 3 and a metallic wiring film 4, are formed on a front surface of a substrate 1. The substrate is immersed in a tank filled with a chemical etchant. The chemical etchant is preferably prepared by using sulfuric acid, hydrochloric acid, nitric acid, hydrofluoric acid, and a mixture of nitric acid and hydrofluoric acid solely or as a combination of two or more selected from them.

Figure 3:
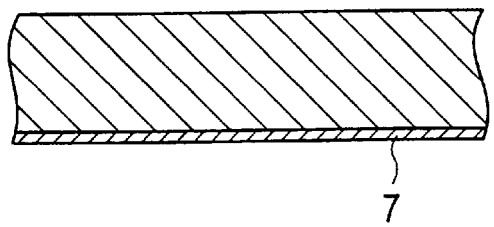
FIG. 3 is a partial sectional view of the wafer in which a back surface has been blasted (scraped off in a small amount) according to the reclaiming process of the present invention.

Then, a back surface 5 of the wafer substrate (FIG. 2) after being subjected to the chemical etching is scraped off in small amount by blasting (FIG. 3). The blasting is preferably carried out by blasting hard particles against the wafer surface.

Blasting is a method for removing a surface layer of a workpiece by impinging hard abrasive grains against the workpiece. There are two types of blasting, i.e., dry blasting using air as a medium to carry abrasive grains therewith, and wet blasting using water as the medium. The dry blasting has such disadvantages that environment is deteriorated due to generation of powdery dust, and that the abrasive grains and a scraped-off workpiece material tend to remain on the workpiece surface. On the other hand, the wet blasting is somewhat inferior in machining performance to the dry blasting, but has such advantages that no powdery dust is generated, and that the abrasive grains and a scraped-off workpiece material are surely moved away from the workpiece surface. Further, in the case of using fine abrasive grains with sizes not more than several tens microns ($\mu$m), it is impossible to give sufficient energy to the abrasive grains by the dry blasting. For those reasons, the wet blasting is more preferably employed. The abrasive grains for use in the blasting can be made of various materials. The abrasive grains are required to have such a characteristic that material hardness is enough to remove a surface material of the wafer substrate. Materials usable as the abrasive grains include, for example, aluminum oxide, silicon oxide, silicon carbide, and a mixture of two or more selected from them. From the standpoints of not only ensuring a capability enough to remove the surface material of the wafer substrate, but also suppressing a damage depth as small as possible, sizes of the abrasive grains are not less than 5 $\mu$m but not more than 30$\mu$m, preferably not less than 10 $\mu$m but not more than 20 $\mu$m, as measured in accordance with the sedimentation test method. The back surface of the wafer substrate is scraped off 0.1–5 $\mu$m by the blasting.

In manufacturing processes of wafer substrates, gettering has been conventionally performed with blasting for the purpose of attracting contaminant impurities within the wafer substrate to its back surface. However, blasting used in the gettering is intended to impart lattice strains to the back surface of the wafer substrate and is carried out by selecting conditions not removing a substrate material. Thus, blasting used in the gettering differs in both means and object from the blasting used in the present invention. For example, U.S. Pat. No. 5,051,375 discloses a method wherein abrasive grains for use in blasting are in the spherical form to achieve an appropriate stress distribution.

As a result of removing the material of the wafer substrate from its back surface as described above, even when a metallic contamination layer is left on the substrate back surface after the chemical etching, the remaining metallic contamination layer can be removed. Further, even when a scratch or stain is present in the substrate back surface, the back surface is scraped off into a uniform surface by the mechanical machining.

Figure 4:
FIG. 4 is a partial sectional view of the wafer in which a layer damaged due to the blasting has been removed by chemical etching according to the reclaiming process of the present invention.
Figure 5:
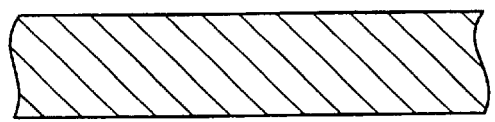
FIG. 5 is a partial sectional view of the wafer in which a front surface has been polished according to the reclaiming process of the present invention.

A crack and/or a damage layer 7 is present in the substrate back surface that has been subjected to the blasting. The crack causes the generation of particles due to peeling-off of the substrate material in a washing step, and the damage layer is responsible for a warp of the substrate upon stresses being out of balance. Accordingly, the crack and the damage layer are removed by chemical etching. FIG. 4 is a partial sectional view showing the wafer substrate after that step of chemical etching. A mixture of nitric acid and hydrofluoric acid, an aqueous solution of potassium hydroxide, or the like is preferably used as an etchant in the chemical etching step. The chemical etching step removes all of the crack and the damage layer that have occurred due to the mechanical machining in the form of blasting.

Then, the front surface of the wafer substrate is finished by chemical mechanical polishing. This step of chemical mechanical polishing can be performed with polishing using colloidal silica that is usually employed in manufacture of prime wafers. While polishing of the prime wafer is usually required to remove the wafer about thickness of 25 $\mu$m, an amount of the substrate material removed by the polishing in the reclaiming process of the present invention can be greatly reduced because the front surface of the wafer substrate is just after being subjected to the chemical etching and is already in the state of a mirror surface.

EXAMPLES

Example 1

A set of twelve used substrates, each comprising a 8" single-crystal Si wafer, having a crystal orientation of {100} face, and having a thickness of 725 $\mu$m, were subjected to a reclaiming process. A film of silicon oxide having a thickness of 5000 Å and an aluminum wiring film having a thickness of 4000 Å were coated on a front surface of each wafer (substrate).

First, the used wafers were each etched at a room temperature for 20 seconds by immersing the wafer in an etchant that was filled in a Teflon-made bath and consisted of nitric acid (69%), hydrofluoric acid (49%) and pure water at a ratio of 3:1:1. The coated films on each wafer after the etching were all removed such that Si surfaces were exposed. The front surface was in the state of a mirror surface and a back surface was in the state of a mat surface, while stains caused by the etching appeared on parts of the surfaces. Then, a liquid prepared by mixing abrasive grains of aluminum oxide, which had an average grain size of 15 μm, in pure water at a concentration of 20 weight % was impinged against the back surface of the wafer under pressure of 2 kg/cm$^2$ by using a wet blasting apparatus. After soaking the blasted wafer in pure water and removing the abrasive grains attached to the wafer with ultrasonic washing, the wafer was etched for 10 minutes in a 35 weight % aqueous solution of KOH heated to 50° C. Then, a polyurethane pad was stuck to a SUS-made polish plate having a diameter φ of 812 mm, and the wafer adhered to a ceramic plate using a wax was positioned in opposing relation to the pad surface and pressed against it under pressure of 200 gf/cm$^2$. The wafer was polished for 12 minutes at a rotational speed of 60 rpm of the polish plate while dripping a polishing liquid of pH 10.5 that contained 2.5 weight % of colloidal silica (average grain size of 60 nm). Then, the ceramic plate including the wafer adhered thereto was positioned in opposing relation to another polish plate, to which a soft polyurethane pad was stuck, and pressed against the pad surface under pressure of 80 gf/cm$^2$. The wafer was further polished for 12 minutes at a rotational speed of 60 rpm of the polish plate while dripping a polishing liquid of pH 10.5 that contained 1 weight % of colloidal silica (average grain size of 35 nm). After the polishing, the wafer was cleaned by standard RCA cleaning method. Then, a wafer thickness was measured by a capacitance type non-contact thickness gauge, and impurities remaining on the front and back surfaces of the wafer were analyzed with total-reflection fluorescence X-ray analysis.

As a result, it was confirmed that all the wafers had thicknesses in the range of 700–705 μm and showed reduction amounts of thickness in the range of 20–25 μm. For all of Al, Cr, Cu, Fe, Ni and Zr, an impurity level was not more than 10×109 numbers/cm$^2$ on the front surface and not more than 10×10$^{10}$ numbers/cm$^2$ on the back surface. It was thus confirmed that the wafer was not influenced by surface contamination due to the etching.

Example 2

A set of twelve used substrates, each comprising a 8" single-crystal Si wafer, having a crystal orientation of {100} face, and having a thickness of 725 μm, were subjected to a reclaiming process. A film of silicon oxide having a thickness of 5000 Å and an aluminum wiring film having a thickness of 4000 Å were coated on a front surface of each wafer (substrate).

First, the used wafers were each etched at a room temperature for 20 seconds by immersing the wafer in an etchant that was filled in a Teflon-made bath and consisted of nitric acid (69%), hydrofluoric acid (49%) and pure water at a ratio of 3:1:1. The coated films on each wafer after the etching were all removed such that Si surfaces were exposed. The front surface was in the state of a mirror surface and a back surface was in the state of a mat surface, while stains caused by the etching appeared on parts of the surfaces. Then, a tool prepared by fixedly attaching, to a polyethylene film, abrasive grains of silicon carbide having an average grain size of 20 μm was fixed to a SUS-made plate. The wafer was set onto a suction pad and a back surface of the wafer was held in contact with the tool surface. The wafer back surface was scraped off in such a condition while pressing the wafer under pressure of 150 gf/cm$^2$ and applying ultrasonic vibrations. After soaking the scraped-off wafer in pure water and removing the abrasive grains attached to the wafer with ultrasonic washing, the wafer was etched for 10 minutes in a 35 weight % aqueous solution of KOH heated to 50° C. Then, a polyurethane pad was stuck to a SUS-made polish plate having a diameter φ of 812 mm, and the wafer adhered to a ceramic plate using a wax was positioned in opposing relation to the pad surface and pressed against it under pressure of 200 gf/cm$^2$. The wafer was polished for 12 minutes at a rotational speed of 60 rpm of the polish plate while dripping a polishing liquid of pH 10.5 that contained 2.5 weight % of colloidal silica (average grain size of 60 nm). Then, the ceramic plate including the wafer adhered thereto was positioned in opposing relation to another polish plate, to which a soft polyurethane pad was stuck, and pressed against the pad surface under pressure of 80 gf/cm$^2$. The wafer was further polished for 12 minutes at a rotational speed of 60 rpm of the polish plate while dripping a polishing liquid of pH 10.5 that contained 1 weight % of colloidal silica (average grain size of 35 nm). After the polishing, the wafer was cleaned by standard RCA cleaning method. Then, a wafer thickness was measured by a capacitance type non-contact thickness gauge, and impurities remaining on the front and back surfaces of the wafer were analyzed with total-reflection fluorescence X-ray analysis.

As a result, it was confirmed that all the wafers had thicknesses in the range of 700–705 μm and showed reduction amounts of thickness in the range of 20–25 μm. For all of Al, Cr, Cu, Fe, Ni and Zr, an impurity level was not more than 10×10$^9$ numbers/cm$^2$ on the front surface and not more than 10×10$^{10}$ numbers/cm$^2$ on the back surface. It was thus confirmed that the wafer was not influenced by surface contamination due to the etching.

Comparative Example

A set of twelve used substrates, each comprising a 8" single-crystal Si wafer, having a crystal orientation of {100} face, and having a thickness of 725 μm, were subjected to a reclaiming process. A film of silicon oxide having a thickness of 5000 Å and an aluminum wiring film having a thickness of 4000 Å were coated on a front surface of each wafer (substrate).

First, the used wafers were each etched at a room temperature for one minute by immersing the wafer in an etchant that was filled in a Teflon-made bath and consisted of nitric acid (69%), hydrofluoric acid (49%) and pure water at a ratio of 3:1:1. After washing, the original front surface of the wafer was polished by using a single-side polishing machine. Then, a polyurethane pad was stuck to a SUS-made polish plate having a diameter φ of 812 mm, and the wafer adhered to a ceramic plate using a wax was positioned in opposing relation to the pad surface and pressed against it under pressure of 200 gf/cm$^2$. The wafer was polished for 30 minutes at a rotational speed of 60 rpm of the polish plate while dripping a polishing liquid of pH 10.5 that contained 2.5 weight % of colloidal silica (average grain size of 60 nm). Then, the ceramic plate including the wafer adhered thereto was positioned in opposing relation to another polish plate, to which a soft polyurethane pad was stuck, and pressed against the pad surface under pressure of 80 gf/cm². The wafer was further polished for 12 minutes at a rotational speed of 60 rpm of the polish plate while dripping a polishing liquid of pH 10.5 that contained 1 weight % of colloidal silica (average grain size of 35 nm). After the polishing, the wafer was cleaned by standard RCA cleaning method. Then, a wafer thickness was measured by a capacitance type non-contact thickness gauge, and impurities remaining on the front and back surfaces of the wafer were analyzed with total-reflection fluorescence X-ray analysis.

As a result, it was confirmed that all the wafers had thicknesses in the range of 695–700 μm and showed reduction amounts of thickness in the range of 25–30 μm. An impurity level was not more than $10 \times 10^9$ numbers/cm² on the front surface for all of Al, Cr, Cu, Fe, Ni and Zr, but $20 \times 10^{11}$ numbers/cm² on the back surface for Al. The impurity level on the back surface of the reclaimed wafer was thus problematic.

From the above results, it is expected that wafers reclaimed by the process of the present invention have a very low metallic contamination level.

As described above, when semiconductor wafer substrates are reclaimed in accordance with the present invention, a metallic contamination level is very low in both front and back surfaces of the wafer substrate because the back surface is scraped off in small amount by mechanical machining. Consequently, reclaimed wafers having high quality can be obtained.

What is claimed is:

1. A process for reclaiming a used wafer substrate, the process comprising the steps of:

removing one or more surface layers of the substrate by chemical etching;

blasting away from the substrate 0.1–5 μm of one surface of the substrate;

removing a damage layer, which has occurred due to the blasting, by chemical etching; and polishing the other surface of the substrate into a mirror finish.

2. The process according to claim 1, wherein sizes of abrasive grains for use in the blasting are not less than 5 μm but not more than 30 μm.

3. The process according to claim 1, wherein the blasting is wet blasting.

4. The process according to claim 1, wherein sizes of abrasive grains for use in the blasting are not less than 10 μm but not more than 20 μm.

5. The process according to claim 1, wherein the abrasive grains for use in the blasting comprise at least one material selected from the group consisting of aluminum oxide, silicon oxide, and silicon carbide.

6. The process according to claim 1, wherein the abrasive grains for use in the blasting comprise aluminum oxide.

7. The process according to claim 1, wherein the abrasive grains for use in the blasting comprise silicon oxide.

* * * * *